United States Patent
Babazadeh et al.

(10) Patent No.: US 9,543,838 B2
(45) Date of Patent: Jan. 10, 2017

(54) PHASE FAULT DETECTION IN SWITCHING POWER CONVERTERS

(71) Applicant: Infineon Technologies AG, Neubiberg (DE)

(72) Inventors: Amir Babazadeh, Laguna Hills, CA (US); Benjamim Tang, Rancho Palos Verdes, CA (US)

(73) Assignee: Infineon Technologies AG, Neubiberg (DE)

( * ) Notice: Subject to any disclaimer, the term of this patent is extended or adjusted under 35 U.S.C. 154(b) by 148 days.

(21) Appl. No.: 14/180,881

(22) Filed: Feb. 14, 2014

(65) Prior Publication Data

US 2015/0236586 A1 Aug. 20, 2015

(51) Int. Cl.
| | |
|---|---|
| G05F 1/00 | (2006.01) |
| H02M 3/157 | (2006.01) |
| H02M 3/158 | (2006.01) |
| G01R 31/40 | (2014.01) |
| H02M 1/32 | (2007.01) |

(52) U.S. Cl.
CPC .............. *H02M 3/157* (2013.01); *G01R 31/40* (2013.01); *H02M 1/32* (2013.01); *H02M 3/1584* (2013.01); *H02M 2001/325* (2013.01); *H02M 2003/1586* (2013.01)

(58) Field of Classification Search
CPC .. H02M 3/156; H02M 3/1588; H02M 3/1583; H02M 3/157
USPC .......................... 323/222, 271, 272, 282–285
See application file for complete search history.

(56) References Cited

U.S. PATENT DOCUMENTS

| | | | | |
|---|---|---|---|---|
| 5,982,160 | A * | 11/1999 | Walters | H02M 3/156 323/222 |
| 6,433,527 | B1 | 8/2002 | Izadinia et al. | |
| 2004/0046535 | A1* | 3/2004 | Duffy | H02M 3/1584 323/283 |
| 2010/0131219 | A1 | 5/2010 | Kenly et al. | |
| 2011/0267019 | A1 | 11/2011 | Krishnamurthy et al. | |

(Continued)

FOREIGN PATENT DOCUMENTS

DE 102010002078 A1 8/2011

OTHER PUBLICATIONS

Cheng, Kuang-Yao et al., "Digital Enhanced V2-Type Constant On-Time Control Using Inductor Current Ramp Estimation for a Buck Converter With Low-ESR Capacitors", IEEE Transactions on Power Electronics, vol. 28, No. 3, Mar. 2013, pp. 1241-1252.

*Primary Examiner* — Nguyen Tran

(74) *Attorney, Agent, or Firm* — Murphy, Bilak & Homiller, PLLC

(57) ABSTRACT

A switching power converter includes a phase operable to deliver a phase current to a load through an inductor. The phase current has an expected sawtooth or triangular ripple pattern. The switching power converter further includes a measuring unit operable to measure the phase current at two or more different points of a switching cycle during which the phase is turned on over a first interval of the switching cycle and turned off over a second interval of the switching cycle. The switching power converter also includes an analysis unit operable to determine whether the phase is faulty based on the phase current measurements taken at the two or more different points of the switching cycle. A corresponding method of detecting a phase fault in a switching power converter is also provided.

23 Claims, 9 Drawing Sheets

(56) References Cited

U.S. PATENT DOCUMENTS

| | | |
|---|---|---|
| 2011/0316508 A1 | 12/2011 | Cheng et al. |
| 2012/0078556 A1 | 3/2012 | Holmberg et al. |
| 2012/0139514 A1* | 6/2012 | Paatero ................. H02M 3/156 323/282 |
| 2012/0223692 A1 | 9/2012 | Prodic et al. |
| 2012/0293155 A1 | 11/2012 | Chan et al. |
| 2013/0009479 A1 | 1/2013 | Khanna et al. |
| 2013/0049712 A1 | 2/2013 | Ueno et al. |
| 2015/0207410 A1* | 7/2015 | Ono .................... B60L 11/1851 307/10.1 |

\* cited by examiner

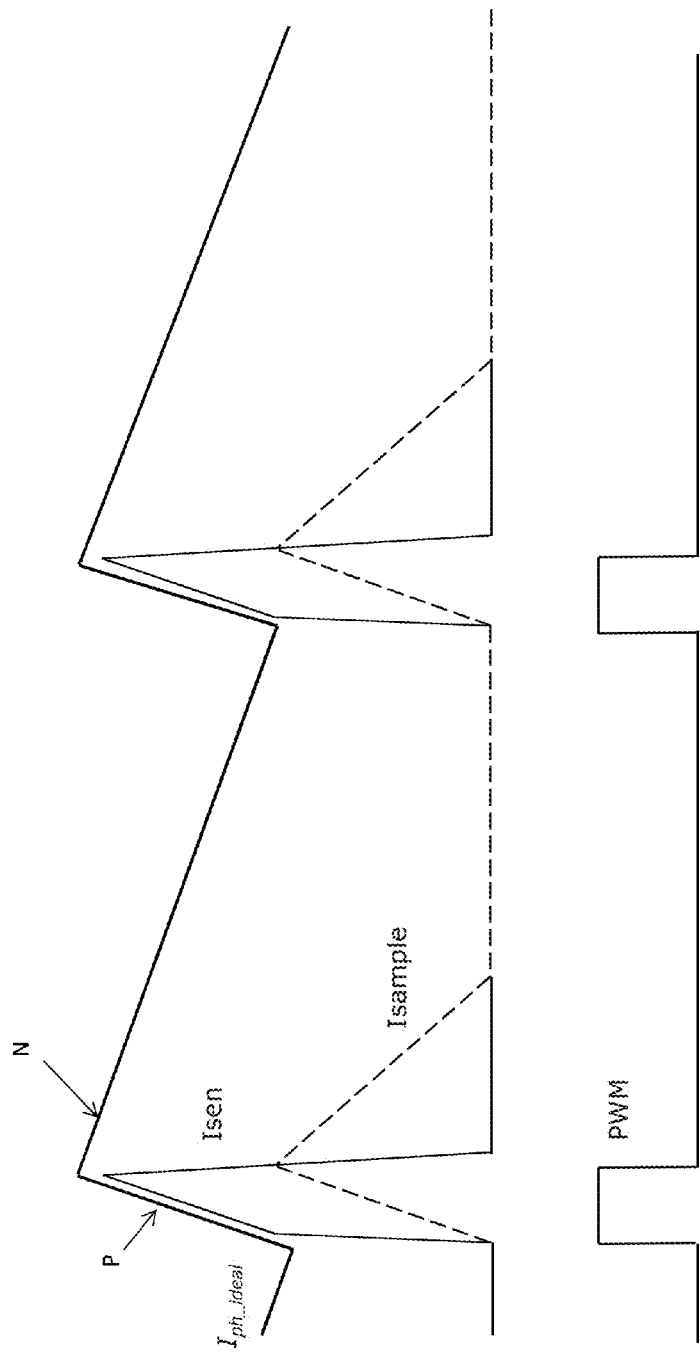

PHASE FAULT DETECTION IN SWITCHING POWER CONVERTERS

TECHNICAL FIELD

The present application relates to switching power converters, in particular detecting phase faults in switching power converters.

BACKGROUND

Switching power converters are widely used in a variety of applications and power levels because of their high efficiency and small amount of area/volume consumed. Widely accepted switching power converters include buck, boost, buck-boost, forward, flyback, half-bridge, full-bridge, and SEPIC topologies. Multiphase buck converters are particularly well suited for providing high current at low voltages needed by high-performance integrated circuits such as microprocessors, graphics processors, and network processors. Buck converters are implemented with active components such as a pulse width modulation (PWM) controller IC (integrated circuit), driver circuitry, one or more phases including power MOSFETs (metal-oxide-semiconductor field-effect transistors), and passive components such as inductors, transformers or coupled inductors, capacitors, and resistors. Multiple phases can be connected in parallel to meet high output current requirements.

The large number of components included in switching power converters and the typically high output current and power of such systems make it desirable to detect any component or connection failures in order to verify the full functionality of these systems and ensure that the switching power converters operates properly over its entire operating range. Voltage, current, power and temperature monitoring are commonly implemented to ensure proper operation under varying, unpredictable and unforeseen operating conditions. High-performance integrated circuits such as microprocessors, graphics processors, and network processors require several protection mechanisms to guard against voltage and current variations. Phase fault detection (PFD) is one protection mechanism that protects the load and also provides an effective diagnostic guidance for the user. An efficient, reliable and low-cost PFD scheme is highly desirable.

SUMMARY

According to an embodiment of a method of detecting a phase fault in a switching power converter, the method comprises: measuring a phase current delivered by a phase of a switching power converter to a load through an inductor at two or more different points of a switching cycle during which the phase is turned on over a first interval of the switching cycle and turned off over a second interval of the switching cycle, the phase current having an expected sawtooth or triangular ripple pattern; and determining whether the phase is faulty based on the phase current measurements taken at the two or more different points of the switching cycle.

According to an embodiment of a switching power converter, the converter comprises a phase operable to deliver a phase current to a load through an inductor. The phase current has an expected sawtooth or triangular ripple pattern. The switching power converter also comprises a measuring unit operable to measure the phase current at two or more different points of a switching cycle during which the phase is turned on over a first interval of the switching cycle and turned off over a second interval of the switching cycle. The switching power converter also comprises an analysis unit operable to determine whether the phase is faulty based on the phase current measurements taken at the two or more different points of the switching cycle.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 8B illustrates various waveform diagrams associated with a faulty low-side current mirror detected by the integrated current sense network of FIG. 7.

DETAILED DESCRIPTION

The embodiments described herein analyse phase current measurements for a switching power converter to detect possible phase faults. The phase current can be measured at two or more different points of the phase switching cycle to measure the positive and negative ripple, and the measurement results can be compared to a threshold in order to identify any unexpected response indicating a phase fault. The methods described herein can detect a faulty phase if the current for that phase is not as expected. This can include measuring the phase current at two or more different points during the negative part, positive part or both parts of the phase current. Having two or more samples of either the positive and/or negative part of the phase current can indicate whether the phase current behaves as expected.

Figure 1:
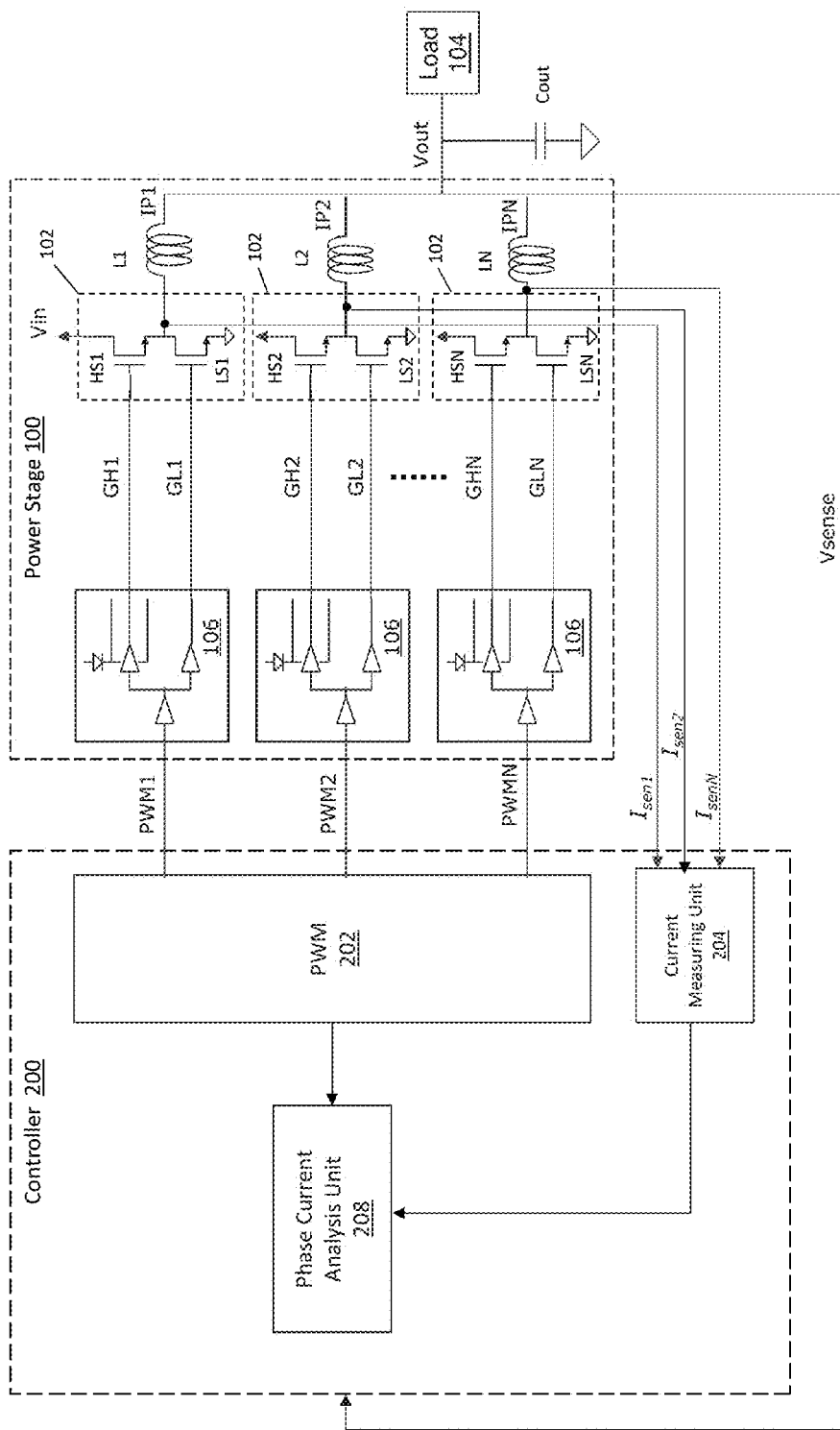
FIG. 1 illustrates a block diagram of an embodiment of a switching power converter with phase fault detection.

FIG. 1 illustrates an embodiment of a switching power converter comprising a power stage 100 including a plurality of phases 102 and a controller 200 such as a microcontroller, microprocessor, ASIC (application-specific integrated-circuit), etc. for controlling operation of the power stage 100. Each phase 102 is operable to deliver a phase current (IPX)

through a separate inductor (LX) to a load 104 connected to the switching power converter via the inductors and an output capacitor (Cout). The inductor currents are labeled IP1, IP2, . . . , IPN in FIG. 1. The load 104 can be a high-performance integrated circuit such as a microprocessor, graphics processor, network processor, etc. or other type of integrated circuit requiring voltage regulation.

Each phase 102 has a high-side transistor (HSX) and a low-side transistor (LSX) for coupling to the load 104 through the corresponding inductor. The high-side transistor of each phase 102 switchably connects the load 104 to an input voltage (Vin) of the switching power converter, and the corresponding low-side transistor switchably connects the load 104 to ground at different periods. Three phases 102 are shown in FIG. 1 (N=3) for ease of illustration only, however the power stage 100 can include any number of phases 102 including a single phase or more than one phase.

The controller 200 regulates the voltage (Vsense) delivered to the load 104 by the power stage 100, by adjusting the phase currents delivered to the load 104. The controller 200 includes a pulse width modulator (PWM) 202 for switching each phase 102 of the power stage 100 via a PWM control signal (PWM1, PWM2, . . . , PWMN) so that the power stage 100 sources or sinks current to the load 104 through the corresponding inductor and the high-side or low-side transistor. When the PWM control signal is at a logic level high, the high-side transistor is placed in a conductive state, the inductor current is sourced or sunk through the high side transistor, and the current through the inductor increases for the duration. This is generally referred to herein as the 'on-time' and the power stage 100 is considered to be 'turned on'. When the PWM control signal is at a logic level low, the low-side transistor is placed in a conductive state, the current is sourced or sunk from the low-side transistor, and the current through the inductor decreases for the duration. This is generally referred to herein as the 'off-time' and the power stage 100 is considered to be 'turned off'. When the PWM control signal is at a trivalent or high impedance logic level (the PWM control signal is neither high nor low), both the high-side and the low-side transistors are placed in a non-conductive state, the current is sourced or sunk through either the low-side or high side transistor body diodes, and the magnitude of the current through the inductor decreases towards zero. This is generally referred to herein as the 'HiZ-time' or 'inactive time' and the power stage 100 is considered to be in 'High Z' or inactive. Alternatively, a second digital input can be used to enable or disable the power stage 100, such that the inputs can represent the power stage 100 high-side conductive, low-side-conductive, and non-conductive states. During CCM (continuous conduction mode), each switching cycle consists of one 'on-time' and one 'off-time' with minimal dead time in between for transitioning between which transistor is in a conductive state. The switching power converter can source or sink current, and the inductor current has an expected sawtooth or triangular shape or ripple pattern, since the inductor current must be either decreasing or increasing depending on which transistor is conductive. In DCM (discontinuous conduction mode), the low side transistor is not allowed to be conductive when the inductor current is zero. The cycle then consists of an on-time, followed by an off-time', followed by a HiZ time. During the HiZ time, the inductor current approaches zero and does not change for the duration of the cycle once it is near zero.

In either CCM or DCM, the drivers 106 provide gate drive signals (GHX, GLX) to the gates of the high-side and low-side transistors of the corresponding phases 102 in response to the PWM control signals provided by the PWM 202. The activation state of the phases 102 and the duty cycle of the high-side and low-side transistors are determined at least in part based on the output voltage (Vsense) applied to the load 104 so that the switching power converter can react as quickly and reliably as possible to changing load conditions.

The controller 200 can manage changes from one reference voltage to another. The controller can also determine errors between the output voltage (Vsense) and a reference voltage, and convert the error voltage into a digital representation provided to the PWM 202 for modifying the switching cycle of the phases e.g. by adjusting the duty cycle. Such voltage regulation functions are standard in typical digitally-controlled switching power converters, and therefore no further explanation is given in this regard.

In addition to regulating the voltage delivered to the load 104, the controller 200 also monitors the phase currents delivered by the phases 102 to the load 104 e.g. by sensing the phase currents injected into the corresponding inductors (IsenX). The controller 200 can determine if the monitored phase currents indicate whether any of the individual phases 102 is faulty. Phase faults can occur within the individual phases 102 (e.g. bad high-side and/or low-side transistor), at the individual inductors (e.g. bad connection), or at the output capacitor (e.g. bad connection). The term 'phase fault' as used herein means a component or connection failure (e.g. at any of the drivers, high-side transistors, low-side transistors, and inductors shown in FIG. 1) that affects the proper operation of the phases 102 of the power stage 100. Such a component or connection failure can lead to or more of: non-operation of the high-side gate (i.e. does not turn on or off according to the PMW control signal); non-operation of the low-side gate (i.e. does not turn on or off according to the control signal; non-operation of the phase current sense (i.e. the sensed phase current does not correspond to the actual inductor current); and/or an inductor is missing, has a substantially wrong value or is in saturation. The phase currents can be checked in DCM or CCM.

In more detail, a current measuring unit 204 included in or associated with the controller 200 measures the individual phase currents (Isen1, Isen2, . . . , IsenN) of the phases 102 converts the measured current information into phase current information. In one embodiment, the current measuring unit 204 measures the phase current at two or more different points of the PWM switching cycle. A faulty phase 102 can be detected if the current for that phase is not as expected. This can include measuring the phase current at two or more different points during the negative part, positive part or both parts of the phase current. Having two or more samples of either the positive and/or negative part of the phase current can indicate whether the phase current behaves as expected. For example, one or more of the measurements can be taken above a cycle average of the phase current e.g. at the end of the PWM pulse, and one or more of the measurements can be taken below the cycle average of the phase current e.g. at the beginning of the PWM pulse (see FIG. 4 which is described in more detail later herein). One or more additional measurements can be taken near the cycle average e.g. at or near the midpoint of the PWM pulse.

Figure 2:
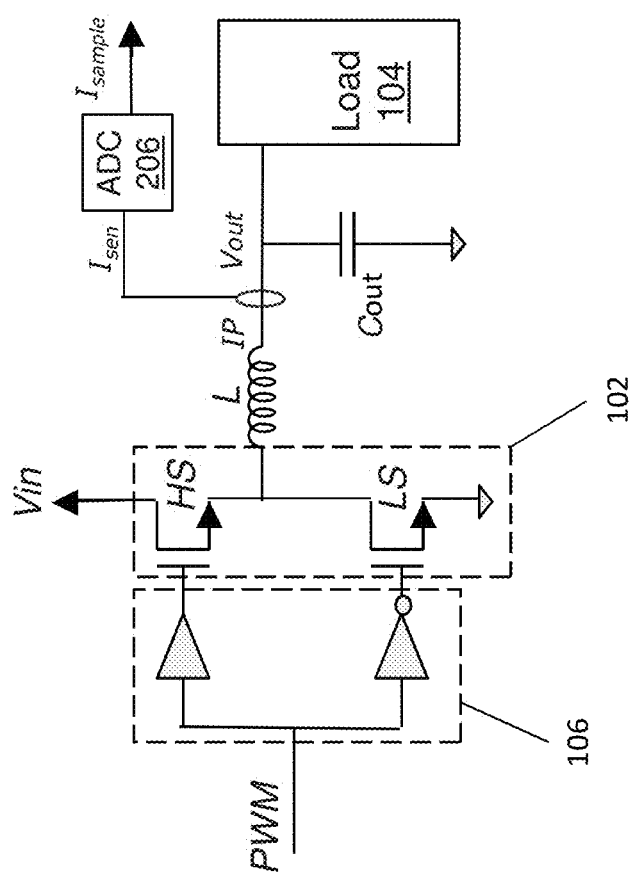
FIG. 2 illustrates a block diagram of an embodiment of a phase and corresponding discrete current sense network included in the switching power converter of FIG. 1.

FIG. 2 illustrates an embodiment of a phase 102 of the switching power converter. According to this embodiment, the current measuring unit 204 is implemented as a DCR (DC resistance) network including an ADC (analog to digital converter) 206 for converting the phase current (Isen) to a sampled digital representation (Isample). Any standard ADC 206 can be used to sample the phase current. The DCR phase fault detection embodiment can detect a broken or loose current sense network with a noisy output or an offset. DCR phase current measurement uses a parallel RC measurement circuit based on the DCR of the inductor. The current waveform through the inductor is replicated as the voltage across the capacitor when the RC time constant is matched to the L/DCR time constant of the inductor e.g. as described in U.S. Pat. Nos. 5,982,160 and 6,469,481 both of which are incorporated herein by reference in their entirety. In DCR current sense, a missing, incorrect, or broken R or C results in the voltage across the capacitor not matching the expected triangular or sawtooth waveform pattern. This faulty condition can be detected by a phase current analysis unit 208 included in or associated with the controller 200 as not matching the ideal current waveform.

In general, the phase current analysis unit 208 analyzes the phase current information obtained by the current measuring unit 204 to determine whether a phase fault has occurred. For example, the phase current analysis unit 208 can detect whether the switching power converter has missing phase components or missing connections based on the phase current information provided by the current measuring unit 204. One or both of the phase current analysis unit 208 and the current measuring unit 204 can be integrated as part of the controller 200, or implemented as discrete components which are communicatively connected to the controller 200. Operation of the phase current analysis unit 208 and the current measuring unit 204 is described next in more detail with reference to FIGS. 3 and 4.

Figure 3:
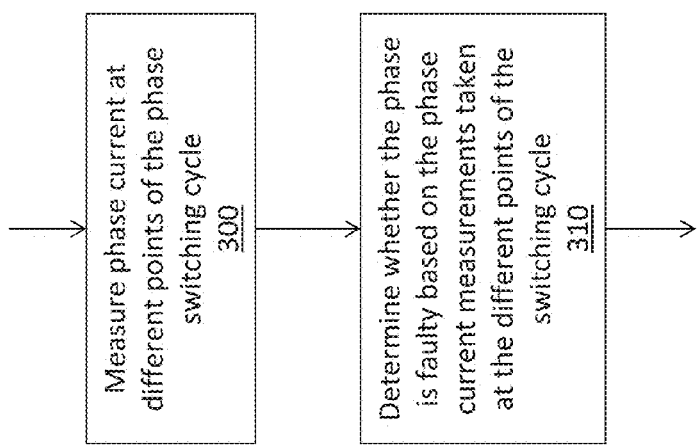
FIG. 3 illustrates a flow diagram of an embodiment of a method of phase fault detection in a switching power converter.
Figure 4:
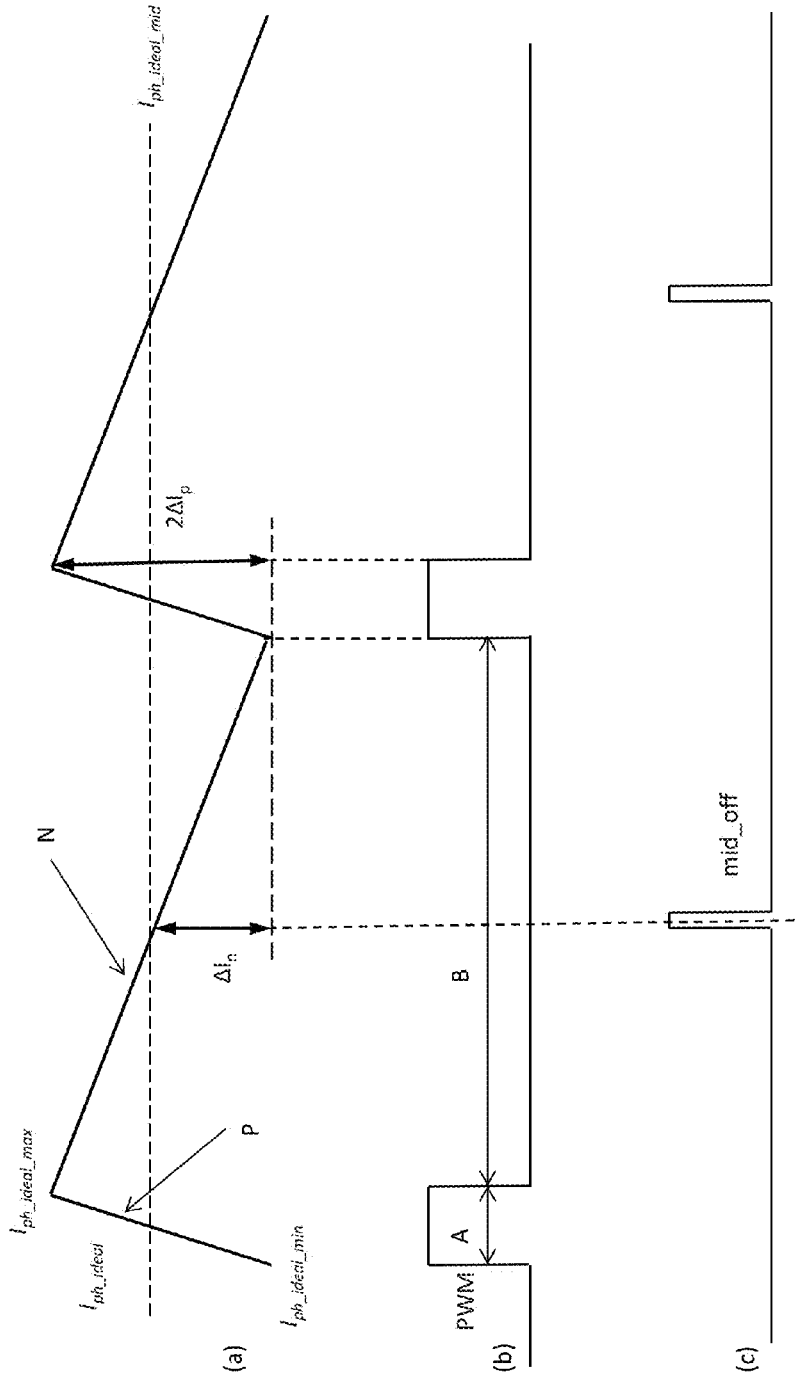
FIG. 4 illustrates various waveform diagrams associated with the phase fault detection method of FIG. 3 and operation of the switching power converter of FIG. 1.

FIG. 3 illustrates an embodiment of a method of detecting a phase fault in the phase 102 of the switching power converter shown in FIG. 2, and FIG. 4 illustrates various waveforms corresponding to the operation of that phase 102.

The phase fault detection method of FIG. 3 includes measuring the actual phase current (Isen) at two or more different points of the phase switching cycle during which the phase 102 is turned on over a first interval of the switching cycle and turned off over a second interval of the switching cycle (Block 300). Waveform (a) in FIG. 4 shows the ideal phase current (Iph_ideal), which has an expected sawtooth or triangular ripple pattern. The inductor current of each phase 102 has the expected waveform (a) in FIG. 4 when the phase 102 functions properly (i.e. as expected or designed) e.g. when there are no faulty transistors included in the phase 102, the inductor coupled to the phase 102 is not faulty, the output capacitor is not faulty, and the connections between the phase 102 and the load 104 are not defective. Otherwise the current delivered by the phase 102 will not have the expected waveform (a) in FIG. 4, but instead the positive (P) and/or negative (N) ramp of the phase current will have a steeper or narrower slope than expected or even be missing. This condition corresponds to a broken integrated current sense. For a DCR-type failure, the waveform of the actual phase current is either zero or noisy or somewhat not similar to the expected waveform (a) in FIG. 4.

The term 'ripple' as used herein describes the sawtooth/triangular shape of the ideal phase current. Waveform (b) in FIG. 4 shows the PWM control signal provided to the driver 106 connected to the phase 102 under analysis. In each switching cycle of the phase 102, the PWM control signal has a first interval (A) during which the PWM control signal is active and switches on the high-side transistor of the phase 102. The remainder of the PWM switching cycle corresponds to a second interval (B) of the PWM control signal during which the PWM control signal is inactive and switches on the low-side transistor of the phase 102. In some cases, the phase 102 can be tri-stated i.e. placed in a high-impedance (HiZ) state. Waveform (c) in FIG. 4 shows the midpoint of the second interval of the phase switching cycle in a normal state.

The ideal phase current (Iph_ideal) has an expected positive slope (P) during the first interval (A) of the phase switching cycle if the phase 102 functions properly and an expected negative slope (N) during the second interval (B) of the switching cycle if the phase 102 functions properly. The phase current analysis unit 208 can determine whether the phase 102 is faulty based on the phase current measurements taken at two or more different points of the switching cycle. For example, the phase current analysis unit 208 can determine whether a first pair of the current measurements indicates the phase current has a faulty positive slope (P) and whether a second pair of the current measurements indicates the phase current has a faulty negative slope (N).

The current measuring unit 204 e.g. the ADC 206 in FIG. 2 measures the phase current (Isen) at a fixed sampling rate for analysis by the phase current analysis unit 208. The points at which the phase current is measured can depend on the impedance state of the phase 102. For example if the phase 102 is in a normal state, the current measuring unit 204 measures the phase current (Isen) at the midpoint (mid_off) of the second interval (B) of the switching cycle, measures the phase current at the beginning of the first interval (A) of the switching cycle (i.e. at the rising edge of the PWM pulse), and measures the phase current at the end of the first interval of the switching cycle (i.e. at falling edge of the PWM pulse). If the phase 102 goes to the high impedance state (HiZ), the phase fault detection function can be deactivated. In general, the current measuring unit 204 measures the phase current at two or more different points of the PWM switching cycle. This can include measuring the phase current at two or more different points during the negative part, positive part or both parts of the phase current. Having two or more samples of either the positive and/or negative part of the phase current can indicate whether the phase current behaves as expected. For example, one or more of the measurements can be taken above a cycle average of the phase current (the cycle average of the phase current is indicated by Iph_ideal_mid in FIG. 4) e.g. at the end of the PWM pulse, and one or more of the measurements can be taken below the cycle average of the phase current e.g. at the beginning and/or midpoint of the PWM pulse. Additionally, one or more measurements can be taken near the cycle average of the phase current e.g. at or near mid-off in FIG. 4. The cycle average of the phase current can be computed by combining one or more of the phase current measurements.

The phase fault detection function can be activated in some states and deactivated in other states. For example, the phase fault detection function can be deactivated if the output voltage (Vout) is lower than a threshold or the switching power converter is in startup mode. In general, the phase current analysis unit 208 determines whether the phase 102 is faulty based on the phase current measurements taken at the two or more different points of the switching cycle by the current measuring unit 204 (Block 310). For example if the phase 102 is in a normal state, the phase current analysis unit 208 determines a first difference value (ΔIn) between the phase current measured at the midpoint (mid_off) of the second interval (B) of the switching cycle and the phase current measured at the beginning of the first interval (A) of the switching cycle (i.e. at the rising edge of the PWM pulse). The phase current analysis unit 208 also determines a second difference value (ΔIp) between the phase current measured at the beginning of the first interval of the switching cycle and the phase current measured at the end of the first interval of the switching cycle i.e. at the falling edge of the PWM pulse.

In general, phase current analysis unit 208 uses the first difference value (ΔIn) to examine the negative part of the phase current slope and the second difference value (ΔIp) to examine the positive part of the phase current slope. The second difference value can be determined by subtracting the phase current measured at the beginning of the first interval of the switching cycle from the phase current measured at the end of the first interval of the switching cycle to yield a difference (2ΔIp) and scaling 2ΔIp by half to yield ΔIp.

In either case, the phase 102 is determined to be faulty by the phase current analysis unit 208 if the minimum of the first and second difference values (Min{ΔIn, ΔIp}) fails to exceed a threshold value. The threshold value can be percentage of the expected phase current ripple pattern. For example, if the measured phase current remains lower than a percentage of the expected phase current ripple pattern for a number of specified cycles, then there is a phase fault. In one embodiment, the phase current ripple pattern (Iph_ideal) has a maximum value (Iph_ideal_max) and a minimum value (Iph_ideal_min) and the threshold value corresponds to 50% or less of the maximum value of the expected phase current ripple pattern. Any suitable threshold can be used to optimize the sensitivity of the phase current analysis unit 208 to phase faults.

Figure 5:
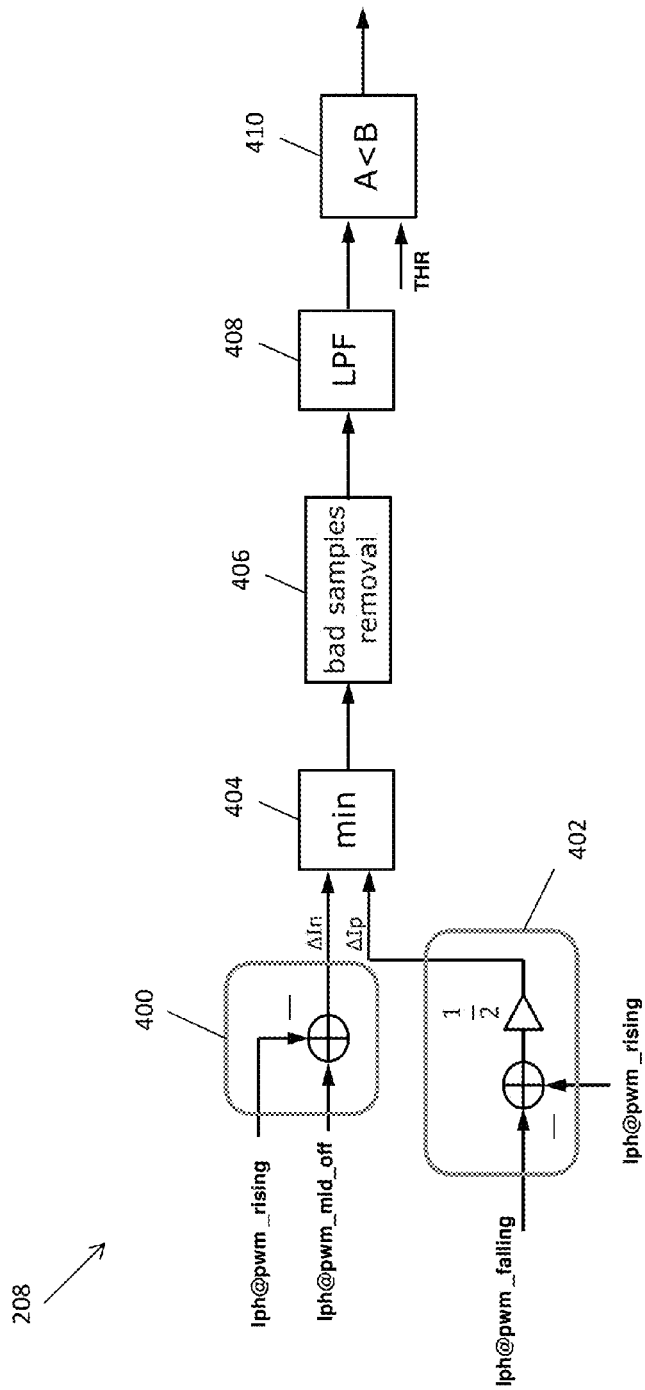
FIG. 5 illustrates a block diagram of an embodiment of a phase current analysis unit included in a switching power converter.

FIG. 5 illustrates an embodiment of the phase current analysis unit 208 that compares the minimum of the first and second difference values (Min{ΔIn, ΔIp}) to a threshold value to determine whether the phase 102 is faulty. The phase current analysis unit 208 includes a first subtractor 400 for calculating the first difference value ΔIn by subtracting the phase current measured at the beginning of the first interval of the switching cycle (Iph@pwm_rising) from the phase current measured at the midpoint of the second interval (Iph@mid_off). The phase current analysis unit 208 includes a second subtractor 402 for calculating the second difference value ΔIp by subtracting Iph@pwm_rising from the phase current measured at the end of the first interval of the switching cycle (Iph@pwm_falling) and scaling the difference by half (½).

The phase current analysis unit 208 also includes a logic block 404 for determining the minimum of the first and second difference values (Min{ΔIn, ΔIp}). The phase current analysis unit 208 can include another logic block 406 that removes bad samples. For example, the phase 102 can have typical switching cycles during which the PWM control signal is set within some normal range and atypical switching cycles during which the PWM control signal is outside the normal range e.g. by adding PWM pulses, substantially widening the PWM pulses, etc. in response to large changes in load demand or low ripple such as when the output voltage is low. The sample removal logic block 406 can ignore the phase current measurements taken during the atypical switching cycles.

The phase current analysis unit 208 further includes a low pass filter (LPF) 408 according to this embodiment for averaging the phase current measurements taken over a plurality of switching cycles for the phase 102. The phase current analysis unit 208 determines whether the phase 102 is faulty based on the averaged phase current measurements output by the filter 408. To this end, the phase current analysis unit 208 includes a comparator 410 for comparing the output of the low pass filter 408 to a threshold value (THR). The phase current analysis unit 208 indicates a faulty phase to the controller 200 if the output of the low pass filter 408 fails to exceed the threshold value. The phase current analysis unit 208 can include any standard digital low pass filter 408 for averaging the phase current measurements taken over a plurality of switching cycles for the phase 102 under analysis. Alternatively, the logic block 406 and the filter 408 can be moved in front of the comparator 410 in order to average the phase fault decisions prior to comparison with the threshold value (THR). In this embodiment, the phase fault decisions are averaged over two or more PWM switching cycles and the average is compared to the threshold value.

Figure 6:
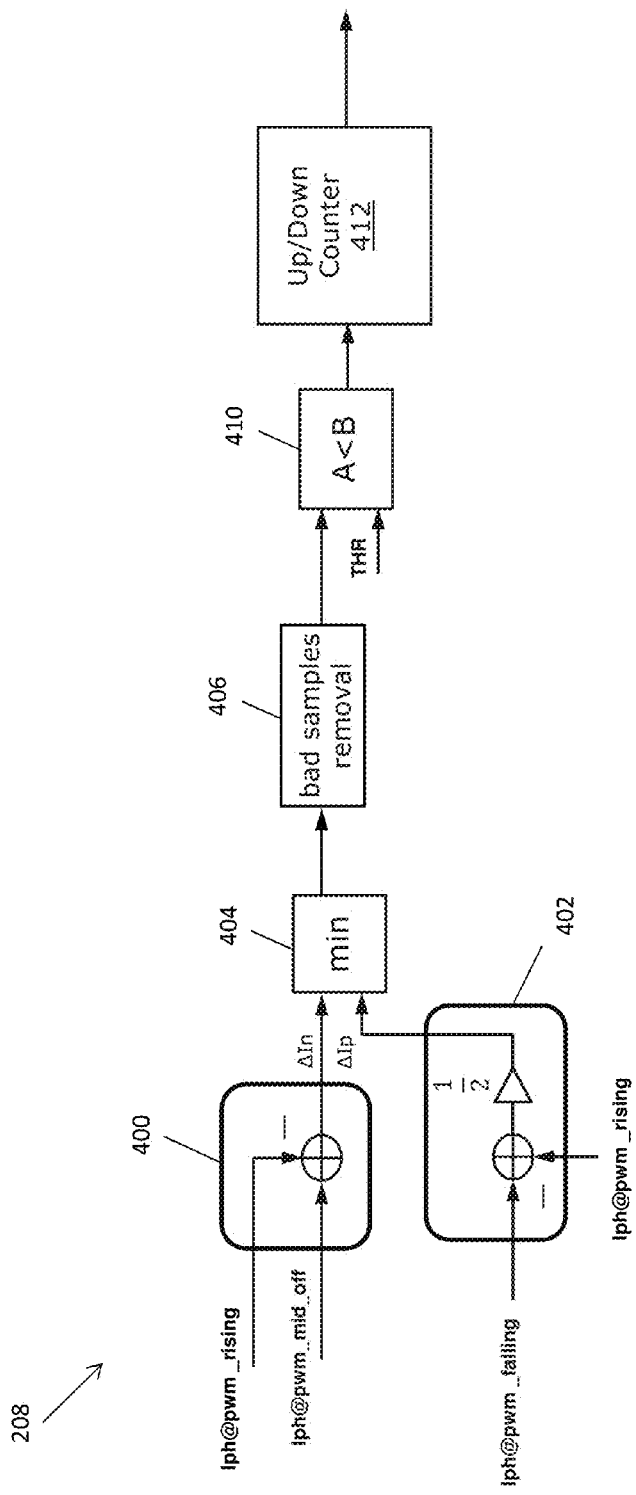
FIG. 6 illustrates a block diagram of another embodiment of a phase current analysis unit included in a switching power converter.

FIG. 6 illustrates another embodiment of the phase current analysis unit 208. The embodiment shown in FIG. 6 is similar to the embodiment shown in FIG. 5, however, the low pass filter 408 is replaced with an up/down counter 412 for averaging the phase current measurements taken over a plurality of switching cycles for the phase 102 under analysis. According to the embodiment of FIG. 6, the minimum of each corresponding pair of first and second difference values (Min{ΔIn, ΔIp}) is compared to the threshold (THR) by the comparator logic block 404 and the pass/fail result is accumulated by the counter 412 over a predetermined time window to smooth (average) the phase current measurements over the window. The phase current analysis unit 208 shown in FIG. 6 can include a logic block 406 for removing bad samples as described above in connection with FIG. 5. Such a logic block is not shown in FIG. 6 for ease of illustration. In general, any fault that causes the phase current to behave differently than expected can be detected according to the embodiments described herein. FIGS. 5 and 6 represent some implementation examples. In another embodiment, either ΔIn or ΔIp can be used to detect a phase fault instead of both ΔIn and ΔIp. If just ΔIn or ΔIp is individually used, then at least two phase current measurement points are needed. For example, either Min{ΔIn, ΔIp} can be used or just ΔIn or ΔIp can be used instead of Min{ΔIn, ΔIp}.

Figure 7:
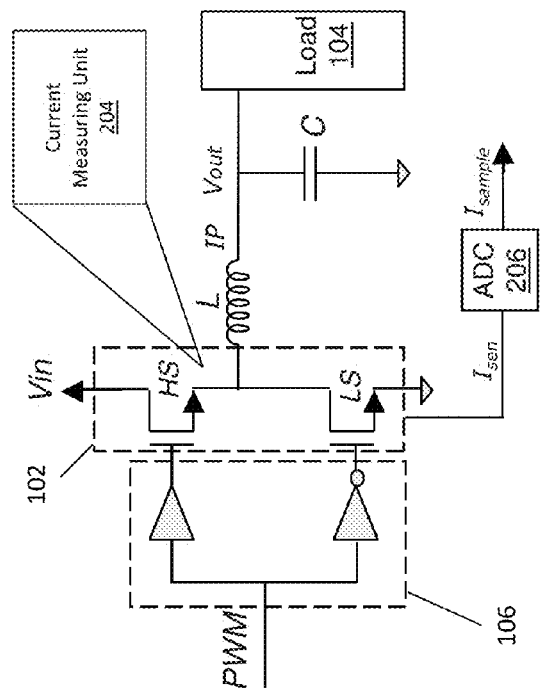
FIG. 7 illustrates a block diagram of an embodiment of a phase and corresponding integrated current sense network included in the switching power converter of FIG. 1.
Figure 8A:
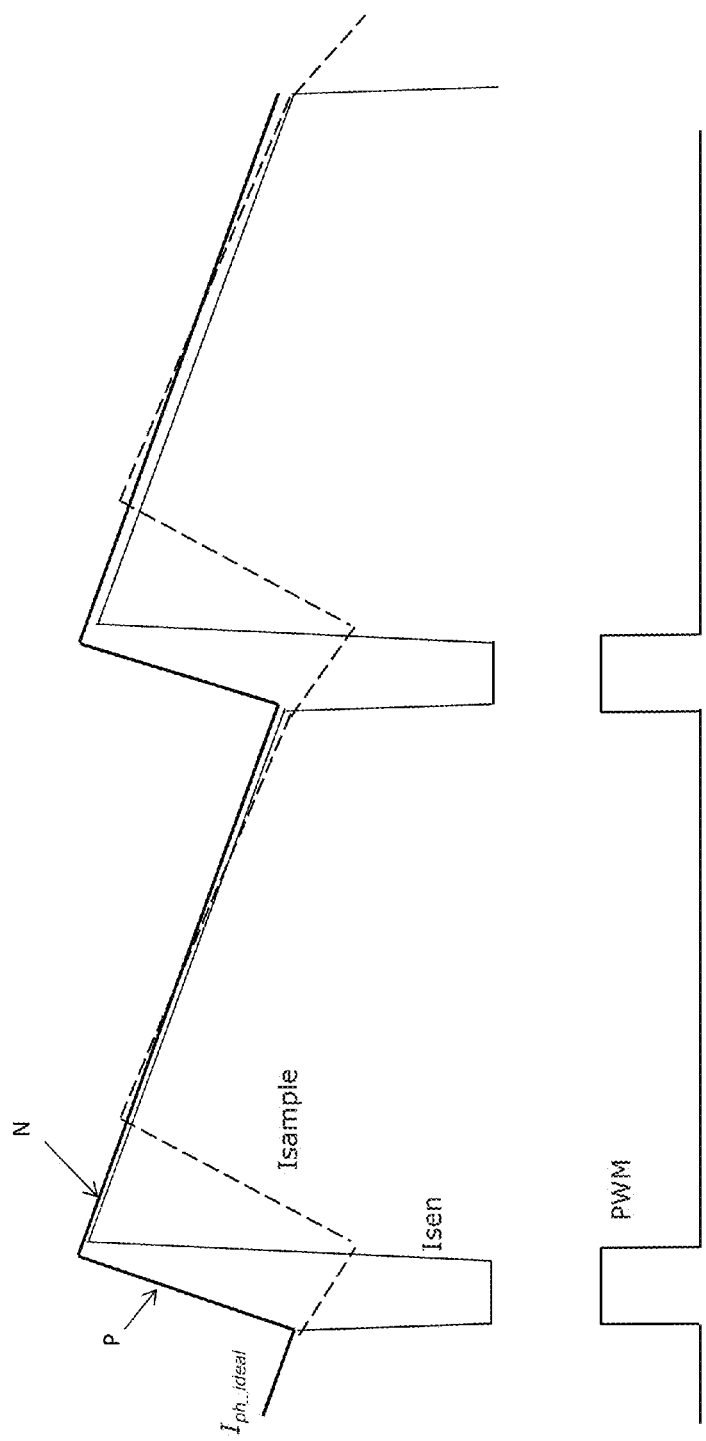
FIG. 8A illustrates various waveform diagrams associated with a faulty high-side current mirror detected by the integrated current sense network of FIG. 7.

FIG. 7 illustrates another embodiment of a phase 102 of the switching power converter. According to this embodiment, the current measuring unit 204 is implemented as an integrated current sense network in which the current sense network can integrated with the high-side and low-side transistors of the phase 102 and include current mirrors for sensing the phase current. The integrated phase fault detection embodiment can detect a fault in either one of the current mirrors. For example, a missing positive ramp (P) in the sensed phase current (Isen) as shown in FIG. 8(A) can be detected by the phase current analysis unit 208 comparing the sampled phase current (Isample) output by the ADC 206 to the expected phase current waveform (Iph_ideal) during a period when the PWM control signal (PWM) is active (i.e. when a PWM pulse is present). A faulty positive ramp in Isample indicates that the high-side current mirror is defective. A missing negative ramp (N) in the sensed phase current (Isen) as shown in FIG. 8(B) can also be detected by the phase current analysis unit 208 comparing Isample to Iph_ideal during a period when the PWM control signal (PWM) is inactive (i.e. when the PWM pulse is not present). A faulty negative ramp in Isample indicates that the low-side current mirror is defective. In each case, the sampled phase current (Isample) output by the ADC 206 and analyzed by the phase current analysis unit 208 indicates whether the positive and/or negative ramp of the phase current is faulty as compared to the expected phase current waveform (Iph_i- deal). The controller 200 can take corrective action responsive to an indication of a faulty phase. For example, the faulty phase(s) can be deactivated or the switching power converter can be shut down e.g. in the case of a multiphase buck-buck converter. Alternatively, the controller 200 can signal a warning over a pin or a digital bus but continue regulation in response to a faulty phase indication.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of detecting a phase fault in a switching power converter, the method comprising:
    measuring a phase current delivered by a phase of a switching power converter to a load through an inductor at two or more different points of a switching cycle during which the phase is turned on over a first interval of the switching cycle and turned off over a second interval of the switching cycle, the phase current having an expected sawtooth or triangular ripple pattern, wherein the measuring yields a phase current sample for each point of the switching cycle at which the phase current is measured;
    determining the difference between two phase current samples in one or more pairs of the phase current samples, so as to yield at least one difference value; and
    determining whether the phase is faulty based on the at least one difference value, each difference value representing the difference between two of the phase current samples.

2. The method of claim 1, wherein measuring the phase current at two or more different points of the switching cycle for the phase comprises:
    measuring the phase current at a midpoint of the second interval of the switching cycle so as to yield a first phase current sample;
    measuring the phase current at the beginning of the first interval of the switching cycle so as to yield a second phase current sample; and
    measuring the phase current at the end of the first interval of the switching cycle so as to yield a third phase current sample, and
    wherein determining whether the phase is faulty based on the at least one difference value comprises:
        determining a first difference value between the first phase current sample and the second phase current sample;
        determining a second difference value between the second phase current sample and the third phase current sample; and
        determining the phase is faulty if the minimum of the first and second difference values fails to exceed a threshold value.

3. The method of claim 1, wherein measuring the phase current at two or more different points of the switching cycle for the phase comprises:
    measuring the phase current at a midpoint of the first interval of the switching cycle so as to yield a first phase current sample;
    measuring the phase current at a midpoint of the second interval of the switching cycle so as to yield a second phase current sample;
    measuring the phase current at the beginning of the first interval of the switching cycle so as to yield a third phase current sample; and
    measuring the phase current at the end of the first interval of the switching cycle so as to yield a fourth phase current sample, and
    wherein determining whether the phase is faulty based on the at least one difference value comprises:
        determining a first difference value between the first phase current sample and the second phase current sample;
        determining a second difference value between the third phase current sample and the fourth phase current sample; and
        determining the phase is faulty if the minimum of the first and second difference values fails to exceed a threshold value.

4. The method of claim 1, wherein one or more of the phase current samples is measured above a cycle average of the phase current, and wherein one or more of the phase current samples is measured below the cycle average of the phase current.

5. The method of claim 1, wherein one or more of the phase current samples is measured above a cycle average of the phase current, wherein one or more of the phase current samples is measured below the cycle average of the phase current, and wherein one or more of the phase current samples is measured near the cycle average of the phase current.

6. The method of claim 1, wherein one or more of the phase current samples is measured above a cycle average of the phase current, wherein one or more of the phase current samples is measured below the cycle average of the phase current, and wherein the cycle average is computed by combining one or more of the phase current samples.

7. The method of claim 1, wherein determining whether the phase is faulty based on the at least one difference value comprises:
    comparing the at least one difference value to a threshold to determine if the phase is faulty.

8. The method of claim 1, wherein the phase current has an expected positive slope during the first interval of the switching cycle and an expected negative slope during the second interval of the switching cycle, and wherein determining whether the phase is faulty based on the at least one difference value comprises:
    determining whether a first pair of the phase current samples indicates the phase current has a faulty positive slope; and determining whether a second pair of the phase current samples indicates the phase current has a faulty negative slope.

9. The method of claim 1, wherein the phase has typical switching cycles and atypical switching cycles, the method further comprising:
ignoring the phase current samples taken during the atypical switching cycles.

10. The method of claim 1, further comprising:
averaging the phase current samples taken over a plurality of switching cycles for the phase, and
wherein the phase is determined to be faulty or not based on the average of the phase current samples.

11. The method of claim 1, wherein the phase is determined to be faulty if the at least one difference value indicates the phase current has a faulty positive slope and/or faulty negative slope as compared to the expected sawtooth or triangular ripple pattern.

12. A switching power converter, comprising:
a phase operable to deliver a phase current to a load through an inductor, the phase current having an expected sawtooth or triangular ripple pattern;
a measuring unit operable to measure the phase current at two or more different points of a switching cycle during which the phase is turned on over a first interval of the switching cycle and turned off over a second interval of the switching cycle, so as to yield a phase current sample for each point of the switching cycle at which the phase current is measured; and
an analysis unit operable to determine the difference between two phase current samples included in one or more pairs of the phase current samples, so as to yield at least one difference value, and to determine whether the phase is faulty based on the at least one difference value, each difference value representing the difference between two of the phase current samples.

13. The switching power converter of claim 12, wherein one or more of the phase current samples is taken above a cycle average of the phase current, and wherein one or more of the phase current samples is taken below the cycle average of the phase current.

14. The switching power converter of claim 12, wherein one or more of the phase current samples is taken above a cycle average of the phase current, wherein one or more of the phase current samples is taken below the cycle average of the phase current, and wherein one or more of the phase current samples is taken near the cycle average of the phase current.

15. The switching power converter of claim 12, wherein one or more of the phase current samples is taken above a cycle average of the phase current, wherein one or more of the phase current samples is taken below the cycle average of the phase current, and wherein the cycle average is computed by combining one or more of the phase current samples.

16. The switching power converter of claim 12, wherein the analysis unit is operable to compare the at least one difference value to a threshold to determine if the phase is faulty.

17. The switching power converter of claim 12, wherein the phase current has an expected positive slope during the first interval of the switching cycle and an expected negative slope during the second interval of the switching cycle, and wherein the analysis unit is operable to:
determine whether a first pair of the phase current samples indicates the phase current has a faulty positive slope; and
determine whether a second pair of the phase current samples indicates the phase current has a faulty negative slope.

18. The switching power converter of claim 12, wherein the phase has typical switching cycles and atypical switching cycles, and wherein the analysis unit is operable to ignore the phase current samples taken during the atypical switching cycles.

19. The switching power converter of claim 12, wherein the analysis unit is operable to average the phase current samples taken over a plurality of switching cycles for the phase and determine whether the phase is faulty based on the average of the phase current samples.

20. The switching power converter of claim 19, wherein the analysis unit comprises a low pass filter or a counter for averaging the phase current samples taken over the plurality of switching cycles.

21. The switching power converter of claim 12, wherein the analysis unit is operable to determine the phase is faulty if the at least one difference value indicates the phase current has a faulty positive slop and/or faulty negative slope as compared to the expected sawtooth or triangular ripple pattern.

22. The switching power converter of claim 12, wherein the measuring unit is implemented as an RC network in parallel with the inductor.

23. The switching power converter of claim 12, wherein the switching power converter is a multiphase switching power converter comprising a controller operable to deactivate the phase responsive to the analysis unit determining the phase is faulty.

* * * * *